united States Patent [19]

Yun et al.

[11] Patent Number: 5,259,436

[45] Date of Patent: Nov. 9, 1993

[54] FABRICATION OF METAL MATRIX COMPOSITES BY VACUUM DIE CASTING

[75] Inventors: David I. Yun, Murrysville; Ralph R. Sawtell, Monroeville; Warren H. Hunt, Export; H. Robert Baumgartner, Monroeville; Eric T. Streicher, New Kensington; Michael F. Ehman, Franklin Park Township, Allegheny County, all of Pa.

[73] Assignee: Aluminum Company of America, Pittsburgh, Pa.

[21] Appl. No.: 682,513

[22] Filed: Apr. 8, 1991

[51] Int. Cl.⁵ .............................................. B22D 19/00
[52] U.S. Cl. ........................................ 164/97; 164/98; 164/113
[58] Field of Search ...................... 164/113, 97, 98, 91, 164/900

[56] References Cited

U.S. PATENT DOCUMENTS

| 3,547,180 | 12/1970 | Cochran et al. | 164/97 |
| 4,340,109 | 7/1982 | Roddy | 164/97 |
| 4,376,804 | 3/1983 | Katzman | 427/314 |
| 4,573,517 | 3/1986 | Booth | 164/113 |
| 4,777,998 | 10/1988 | Charbonnier | 164/259 |
| 4,889,177 | 12/1989 | Charbonnier | 164/97 |
| 4,901,780 | 2/1990 | Sasaki | 164/97 |
| 4,901,781 | 2/1990 | Ruff | 164/97 |
| 4,920,864 | 5/1990 | Skingle et al. | 92/213 |
| 4,961,461 | 10/1990 | Klier et al. | 164/97 |
| 5,111,871 | 5/1992 | Cook | 164/97 |

FOREIGN PATENT DOCUMENTS

| 58-215263 | 12/1983 | Japan | 164/97 |
| 60-145340 | 7/1985 | Japan | |
| 62-238063 | 10/1987 | Japan | 164/97 |
| 62-240152 | 10/1987 | Japan | 164/97 |
| 64-83634 | 3/1989 | Japan | |

OTHER PUBLICATIONS

P. K. Robatgi et al., Solidification Processing of Metal-Matrix Composites, Proceedings of the International Symposium on Advanced Structural Materials, Montreal, Canada, Aug. 22-28, 1985, Pergamon Press, pp. 43-51, 478-481.

M. S. Newkirk, et al., Preparation of Lanxide Ceramic Matrix Composites: Matrix Formation By The Directed Oxidation Of Molten Metals, Ceram. Eng. Sci. Proc., 8(7-8) pp. 879-885. (Dec. 1987).

C. R. Cook, et al., System Optimization For Squeeze Cast Composites, Conference Proceedings of the 1988 World Materials Congress, Sep. 24-30, Chicago, Ill., pp. 195-204.

Rolled Sheet Forging Extrusions Castings, Saic Science Applications International Cororation, 10401 Roselle St., San Diego, Calif. 92121, Aug. 1, 1985 (phamplet, no page numbers).

Donald E. Hammond, Foundry Practice for the First Castable Aluminum/Ceramic Composite Material, Duralcan, San Diego, Calif., Modern Casting, Aug. 1989, pp. 29-33.

Norman R. Wymer, Die Casting Duralcan Aluminum Composites, Duralcan USA, Southfield, Mich., Die Casting Engineer pp. 16 and 18.

A. J. Cook, et al, Pressure Infiltration Casting of Metal Matrix Composites, Materials Science & Engineering, A144 Sep. 1991, pp. 189-206.

Primary Examiner—Mark Rosenbaum
Assistant Examiner—Rex E. Pelto
Attorney, Agent, or Firm—Daniel A. Sullivan, Jr.; Richard V. Westerhoff

[57] ABSTRACT

Metal matrix composites are manufactured in a vacuum die casting machine. Solid aggregate material, at least 65 volume percent, is placed in a die, the die is evacuated and heated, and molten metal is driven by a piston to infiltrate the solid aggregate material where it subsequently solidifies to form a metal matrix composite.

1 Claim, 10 Drawing Sheets

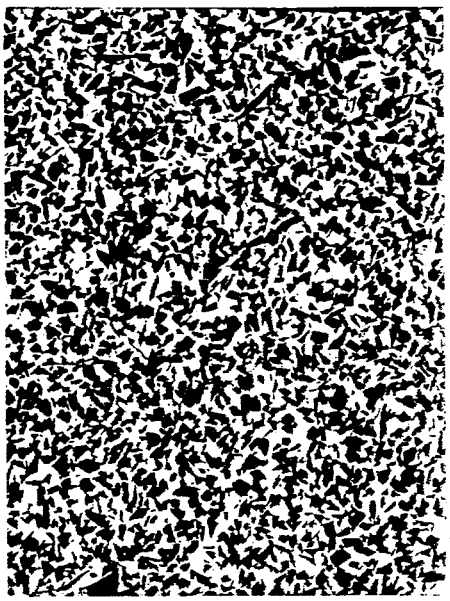
FIG. 5b
FIG. 5d
FIG. 5a
FIG. 5c

FIG.14a 50 μm
FIG.14b 20 μm
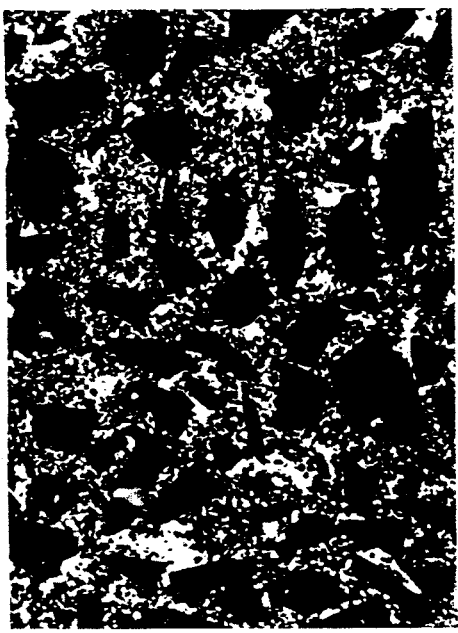
FIG.13a 50 μm
FIG.13b 20 μm

FABRICATION OF METAL MATRIX COMPOSITES BY VACUUM DIE CASTING

TECHNICAL FIELD

This invention relates to the manufacture of metal matrix composites by vacuum die casting.

BACKGROUND OF THE INVENTION

Metal matrix composites (MMC) have been fabricated since the early 1960's primarily by powder metallurgy techniques. Recently, however, liquid methods have been more frequently utilized due to a great saving in manufacturing costs. The most common approach of producing shaped MMC products via the liquid method is to infiltrate open spaces of packed aggregate beds or preforms with molten matrix.

At the present time, the processes employed for fabrication of Al base MMC include a vacuum/low pressure infiltration, a high pressure squeeze casting process, and a pressureless casting process. These processes have the following characteristics:

Low pressure/vacuum infiltration process—The process utilizes a combination of vacuum and a low pressure (less than 1500 psi) gas for metal infiltration. The process has been employed mainly for fabrication of small numbers of R&D samples. It is designed to be a laboratory scale process and is not suitable for low cost, high throughput production in commercial scale.

Pressureless infiltration process—The process relies on capillary force for the infiltration. To develop the capillary force, a wetting between aggregate and matrix materials is obtained through a chemical reaction. The process requires the use of special combinations of matrix alloying element (aluminum with 1 w % (The terms "v %" and "w %" as used throughout this specification mean volume-% and weight-%, respectively.) Mg or higher), heated ceramic aggregate (700 C. or higher), and environment (10 to 100 v % nitrogen). This process thus limits selection of matrix material, for instance to Al-Mg alloys, and is burdened by high manufacturing costs due to extended reaction periods. This process is additionally difficult from a process control standpoint due to the sensitive dependence of the process on surface condition and spontaneous wetting.

High Pressure Squeeze Casting Process—For the infiltration, this process utilizes only high pressure (10,000 to 30,000 psi) using a large hydraulic or mechanical press. The process has the ability to infiltrate a wide range of aggregate and matrix combinations but is quite limited as to complexity and dimensional tolerance of the products produced because of limitations in die design imposed by the needs for high pressure. The product manufacturing costs are also high because of high capital costs for the needed large press.

U.S. Pat. No. 4,920,864 mentions a closed-die pressure casting process to achieve infiltration of a matrix alloy into the interstices of a fiber preform, but does not provide any further information. U.S. Pat. No. 4,777,998 shows die casting of metal parts possibly containing fibers of ceramic materials, but no attempt is made to utilize vacuum die casting principles.

DISCLOSURE OF THE INVENTION

It is an object of the invention to provide an MMC production process which has a combination of quality, repeatability, and flexibility which is superior to previous processes, particularly for making MMC's having a high volume fraction of aggregate.

Another object of the invention is the provision of aluminum or aluminum alloy and silicon carbide metal matrix composites having unique combinations of thermal expansion coefficient and thermal conductivity.

These as well as other objects which will become apparent from the disclosure which follows are achieved according to the systems of Applicant's invention through the use of a vacuum die casting process for fabrication of MMC products. The process has the ability to produce high quality, net shape, or near net shape, thin walled and complexly shaped MMC materials using a variety of aggregate and matrix combinations. The process involves various systems: machinery, aggregate, vacuum and metal input.

A "complex" part of the invention is a part which has a protrusion, such as a wall, web, or fin (which may be a plate fin or a pin fin), which extends from the body of the part at least a distance equal to twice the thickness of the protrusion.

A part of the invention having a "thin-walled" section is a part having a section, such as a wall, web, or fin (which may be a plate fin or a pin fin), whose thickness is ≦0.1 inches, preferrably ≦0.05 inches, and even ≦0.3 inches.

Regarding the die casting machinery for use in the present invention, it comprises the die casting machine itself, dies, and vacuum equipment.

The machine will typically include a fill chamber into which a measured amount of molten metal is collected, and a driven piston for moving the measured metal to the die. The piston drive causes the piston to employ a moderate infiltration pressure (usually less than 10,000 psi) on the metal. Die halves are mounted on fixed and movable platens. The die may be multi-cavity, in order to produce several products at once.

Vacuum equipment is connected for evacuating the die cavity and the fill chamber, in order to remove gas that could otherwise cause porosity in the MMC. The resulting reduction in the presence of oxygen caused by air removal is particularly advantageous in the case of MMC's having matrix and/or aggregate components whose oxidation can lead to decreased properties.

Prior to casting, the die cavity, fill chamber, and piston may receive treatments for lubrication, casting release, etc.

The aggregate of an MMC may be provided by filling the die cavity with packed, unconsolidated aggregate particles. The aggregate may also be provided as consolidated particles, in the form of a so-called preform, placed into the die cavity.

Besides particles, other physical shapes such as fibers, whiskers, or filaments may be used for aggregate. The aggregate may be coated with materials affecting the surface properties of the aggregate. Filaments may be provided in a variety of ways, including numbers of filaments in twisted or untwisted yarns, high bulk filament yarns, etc. Fibers may be woven, braided, knit, unidirectional or randomly oriented. The article entitled "Preform Fiber Architecture for Ceramic-Matrix Composites" by Frank K. Ko, in the American Ceramic Socitey Bulletin for February 1989, (Vol. 68, No. 2), pages 401-414, explains these and other possibilities for provision of aggregate of various kinds of materials. Examples of materials for the aggregate include, besides the SiC of the examples below, carbon, graphite, liquid crystal polymers (e.g. polymers such as "KEVLAR", "KEVLAR 29", "KEVLAR 49", and polybenzobisthiazole (PBZT), "KEVLAR" being a registered trademark of Du Pont for high-strength, low-density synthetic aramid fibers formed from poly-p-phenyleneterephthalamid(PPD-T)), silicon nitride, boron, boron/tungsten, boron carbide/tungsten, boron nitride, beryllium, fused silica, mullite, glass, borosilicate, and oxides, nitrides, carbides, and borides such as zirconia, boron carbide, alumina and aluminum silicate (mullite) and combinations thereof.

Preforms are formed, porous bodies constituted by pieces of aggregate bonded together by a suitable binder for providing green strength. The binder may be an organic material, in which case it is preferred to heat treat the preform prior to placing it into the die cavity; the heat treatment volatilizes the organic material to remove it from the preform and sinters the pieces of aggregate together. In order not to close the pores, which must later receive metal matrix, a low temperature sinter, for instance based on surface diffusion, is preferred. In certain cases, it may not be necessary to heat treat an organic-binder-containing preform prior to placement into the die; instead, reliance may be placed on the moving molten metal front of the infiltrating metal to flash the binder off, into the vacuum system. The binder may also be an inorganic material, such as sodium silicate, where the presence of residues of such is not harmful to the end use of the MMC product. Binderless preforms may also be used, where the aggregate is bonded together by a mechanical interlocking of the individual aggregate pieces. See the article "Highly Ceramic Loaded Net Shape Metal Matrix Composites" by T. B. Shaffer et al., SAE Technical Paper No. 910832, Society of Automotive Engineers, Warrendale, Pa.

The metal input system includes the procedure for introducing metal into the fill chamber of the die casting machine, followed by driving the metal charge from the fill chamber by the piston moving within the chamber. The molten metal moves from the fill chamber and is gated into the die cavity to infiltrate the aggregate.

Two possible metal input systems are the pour system and the suction system. In the pour system, a desired amount of molten metal is poured through an opening in the top of the fill chamber, whereupon the piston moves forward to block the opening to permit the vacuum system to evacuate the die and fill chamber. In the suction system, pressure below atmospheric is used to suck molten metal into the fill chamber.

Aluminum alloys are a preferred material for the matrix, and examples of such alloys are included in the Examples below. However, other matrix materials may be used, examples being essentially pure aluminum and magnesium, magnesium alloys, zinc and zinc alloys, etc. Metals for use in the invention may have melting or liquidus temperatures less than 1000° C., 900° C. or 800° C. Depending on, for instance, materials of construction for dies and fill chamber, other metals may be titanium, copper, tin, nickel, iron, lead, cobalt, and alloys thereof.

Heating means are provided in the fill chamber and in the dies to assure that the molten metal does not solidify until the reinforcing aggregate has been completely infiltrated. Following completion of infiltration, a rapid solidification is advantageous for the metallurgical properties of the matrix and, in cases where such has a tendency to happen, to prevent molten metal reaction with, or dissolution of, aggregate. It is also desirable that solidification be directional, proceeding along a front toward the molten metal source, in order to produce the least possible level of solidification shrinkage. These needs, to get complete infiltration, followed by rapid, and, desirably, directional solidification, require a balancing, or timed control, of temperature conditions. It can be of benefit to allow some interaction between molten matrix and aggregate, in order to get improved interfacial bonding, so there may be a limit on just how rapid solidification should be. However, a particular advantage of the vacuum-assisted pressure die casting process of the present invention is that it provides the ability to combine rapid infiltration and solidification to minimize or eliminate potentially deleterious reactions between the molten metal and the aggregate or reinforcement.

A special advantage of the invention has been found to lie in its ability to achieve essentially porosity-free MMC's containing a high volume fraction of aggregate, particularly volume fractions of 65 v % and above, for instance up to 80 v %, and even 85 v % and above. We achieve this according to the invention by loading the die cavities of vacuum die casting machines with aggregate preforms made, for instance, of sintered particles having distribution of sizes, in order to obtain the interstitial filling needed for high volume fractions. In sintering the preforms for strength and removal of an organic binder, care must be taken not to close the remaining pore volume, because otherwise the matrix infiltration would be blocked and the resulting MMC product would not be pore-free. In being careful, however, not to carry the sintering too far, we inherently achieve a sintered preform that is not as strong as it could otherwise be. This means that infiltration velocity must be controlled so as not to erode the preform. We have discovered that the lower pressures of die casting, as compared to those used in squeeze casting, coupled with the prior evacuation used in the vacuum die casting process, give us a proper balance of conditions, such that we can, without damaging highly loaded preforms, achieve pore-free, high volume fraction aggregate MMC's.

Thus, distinctive features of MMC products of the invention include an essentially porosity-free product with a high aggregate loading at near net shape. Complex configurations characterized by thin (less than 0.1 inch, down to 0.050 inch and even to 0.030 inches and less) walls and highly angled mating surfaces can be produced owing to the unique characteristics of the process, notably the use of vacuum, which lowers infiltration pressures while maintaining the ability to fully penetrate preforms with high aggregate loading. Thus, the advantage of employing vacuum die casting over conventional die or squeeze casting is characterized by the ability to produce high quality, pore-free MMC's with high aggregate loading in complex configurations. These other conventional processes suffer in their inability to produce either essentially pore-free material or complex configurations.

In the context of materials for electronic packaging, the present invention makes possible, for instance, the manufacture of aluminum matrix MMC's having high thermal conductivity coupled with coefficient of thermal expansion (CTE) values considerably less than that of aluminum. The ability of the invention to manufacture complex MMC shapes makes possible, for instance, production of an integrated thermal management system for electronic packaging. This system includes, for instance, a monolithically combined heat exhanger and electronic package lid. The monolithic structure means that there is no joint in the structure which might otherwise interfere with heat flow.

A surface layer of aggregate-free matrix material may be provided on the MMC products of the invention during the vacuum die casting to facilitate joining processes.

As additional advantage of the aluminum matrix MMC's of the invention, their surfaces may be anodized for corrosion protection and for selective placement of electrically insulation areas.

BRIEF DESCRIPTION OF THE DRAWINGS

In FIG. 2b, the lid is in place.

FIGS. 3 and 4 are cross-sectional views of heat exchanger equipped electronic packages. These views are obtained by cutting planes analogous to that in FIG. 2a.

FIGS. 5a to 5d are photomicrographs of sections of a metal matrix composite (MMC) whose matrix is A356 aluminum alloy and which contains 50 v % SiC particulate as aggregate.

FIGS. 13a and 13b are photomicrographs of sections of a 0.10-inch thick by 1-inch by 2-inch, flat MMC whose matrix is 99.995 w % pure aluminum and which contains 65 v % SiC particulate as aggregate.

FIGS. 14a and 14b are photomicrographs of sections of a 0.10-inch thick by 1-inch by 2-inch, flat MMC whose matrix is 99.995 w % pure aluminum and which contains 75 v % SiC particulate as aggregate.

MODES FOR CARRYING OUT THE INVENTION

Process and Equipment

Figure 1:
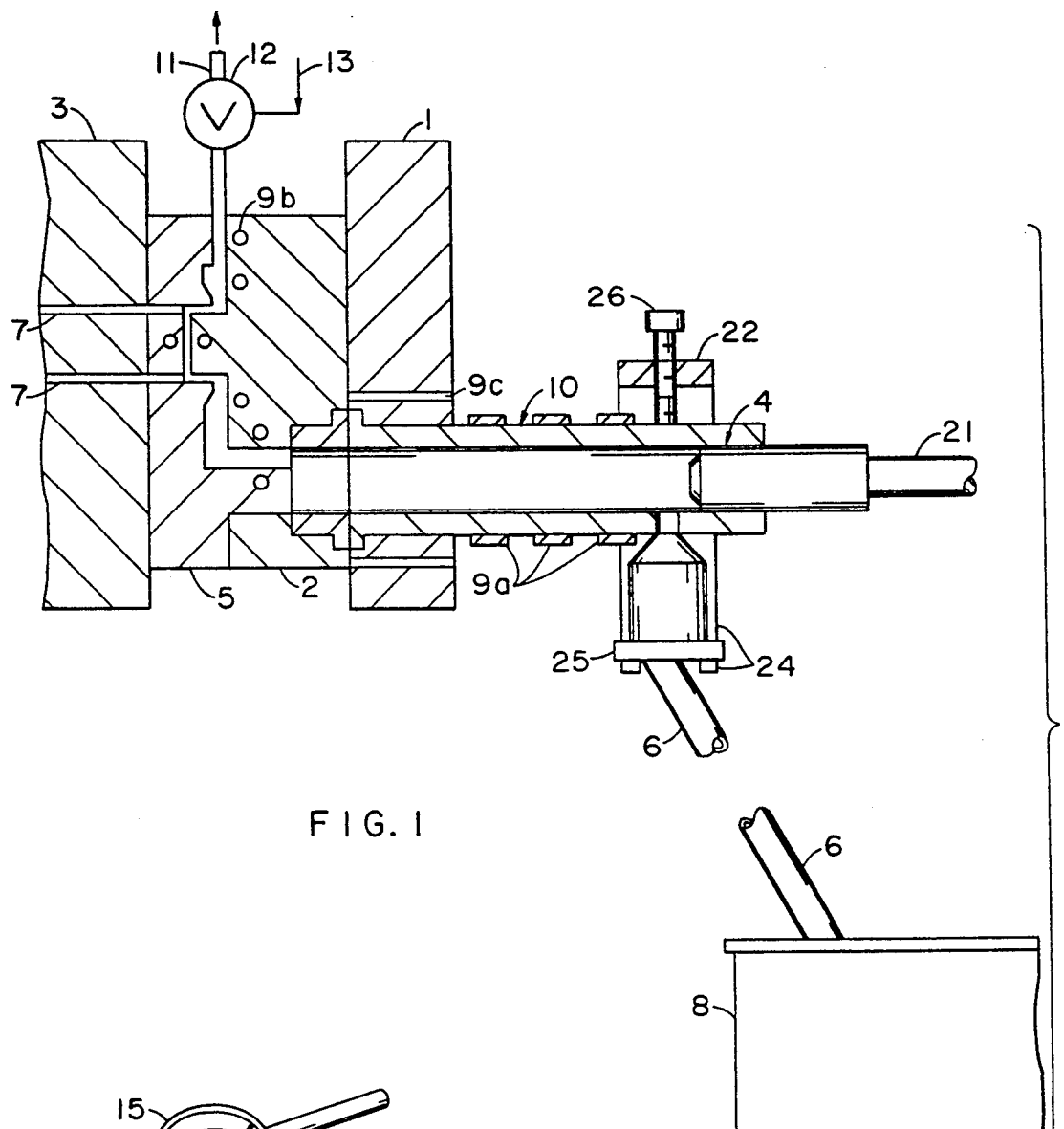
FIG. 1 shows a side view, partially in section, of a die-casting machine for use in carrying out the invention.

Referring to FIG. 1, this figure shows a modified cold chamber, horizontal vacuum die casting machine, including essentially only the region of the fixed clamping plate 1, or platen, with the fixed die, or mold, half 2 and the movable clamping plate 3, or platen, with the movable die, or mold, half 5 of the die casting machine, together with the piston 4, suction tube 6 for molten metal supply, holding furnace 8, and fill chamber 10. The suction tube 6 is connected to the fill chamber 10 by means of a clamp 22. This clamp 22 has a lower hook-shaped, forked tongue 24 which passes underneath an annular flange 25 on the suction tube 6. From the top, a screw 26 is threaded through the clamp 22. This enables a clamping of the end of suction tube 6 to the inlet orifice of the fill chamber 10. Ejector pins (not shown), which move through holes 7, provide means for removing the cast product, when the die halves are opened following solidification of the molten metal matrix.

The vacuum line 11, for removing air and other gases in the direction of the arrow, is connected to the die in the area where the die is last filled by incoming molten metal. Line 11 is opened and shut using valve 12, which may be operated via control line 13 by control equipment (not shown).

Drive means (not shown) is provided to push the piston via the drive rod 21 to develop a metal injection pressure. While pressure will usually be in the range 5000 to 10,000 psi, a machine able to deliver up to 16,000 psi is preferred, in order to provide an ability to handle parts which may require higher pressures.

Strip heaters 9a on the fill chambers and heating elements 9b and 9c, in the form of heater tube cartridges, in the die halves and platens prevent premature solidification of the molten matrix material, before complete infiltration of the aggregate. In the case of Al-10 w %Si alloy with a liquidus temperature of 585° C., solidus of 575° C., the walls of the die cavity and the fill chamber are controlled for instance to 250° C. for this purpose, in a case where input temperature of the molten metal into the fill chamber is 700° C. This temperature of 250° C. is below the solidus of this alloy, but it is an example of a temperature which retards heat loss sufficiently that infiltration can be completed, with solidification nevertheless occuring soon thereafter.

The piston is cooled internally, in order, for instance, to extract heat from the biscuit of matrix alloy left at the fill chamber end, when infiltration has been completed.

The die cavity in FIG. 1 illustrates the forming of box 72 discussed below with respect to the description of FIG. 4. A region of aggregate free matrix is created for the seal-band solder joint by making the aggregate preform of slightly lesser dimension than the die cavity.

Figure 1A:
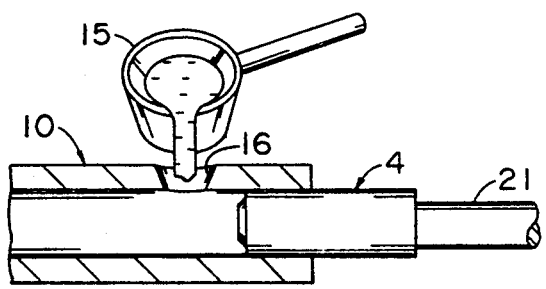
FIG. 1a corresponds to a part of FIG. 1 and shows an alternative metal input system.

The vacuum die caster of FIG. 1 uses vacuum to achieve charging of the fill chamber 10 through suction tube 6. This type of operation is more fully described in International Publication No. WO 90/10516. FIG. 1a shows the charging technique used in the Examples described below. A ladle 15 is used to pour molten aluminum through a charging orifice 16 in the top of the fill chamber.

Products

Figure 2A:
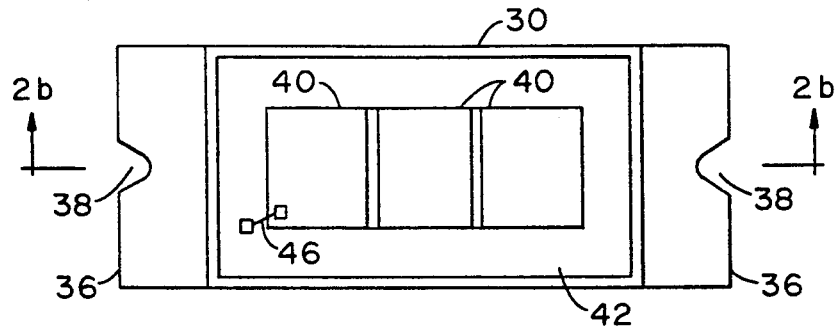
FIG. 2a is a plan view of a "microwave box" electronic package with lid removed.
Figure 2B:
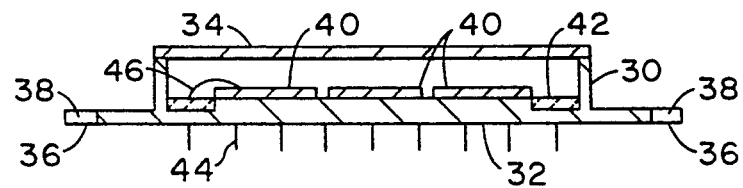
FIG. 2b is a cross-sectional view of the package of FIG. 2a obtained by the cutting plane 2b—2b.

Referring to FIGS. 2a and 2b, these figures show a microwave circuit package. The package is constructed of MMC products of the invention and includes a monolithic bottom section composed of seal band 30 and floor 32 and an upper section in the form of lid 34. Floor 32 is continued externally to form hold-down tabs 36, which are recessed at 38 for reception of a hold-down screw. Three integrated circuit chips 40 are soldered in place on a pedestal protruding upwards from the floor. An alumina substrate 42 surrounds the pedestal and contains conductive paths for electrically connecting different parts of the chips to pins 44 protruding through, and spaced by insulation from the walls of, holes in floor 32. Connection of the different parts of the chips to the conductive paths in the alumina is accomplished by jumper wires between pads on the chips and pads on the alumina. A representative set of pads and wire are shown at 46.

The box is sealed by a laser welding or low temperature soldering of the lid to the seal band. Examples of technology for accomplishing this sealing, as well as for preparing the aluminum alloy pedestal for the soldering of the chips to the pedestal, is contained in the following patents: U.S. Pat. Nos. 3,909,209, 4,270,986, 4,352,450, 4,591,088 (but something other than oil dip for heating, alternatives being furnace heating, local laser heating, or an electric resistance seam sealer), 4,613,069, 4,760,240, 4,946,090, and 4,958,763. In any of these processes which involve flux, precautions are preferred for removing residual flux. As indicated above in the description of the vacuum die casting part of this invention, these joining processes may be facilitated by provision during the die casting of a surface layer of aggregate-free matrix material. In cases where silicon in an aluminum alloy interferes with bonding, the silicon particles may be first etched out of the surface using a nitric acid biflouride etch.

Figure 3:
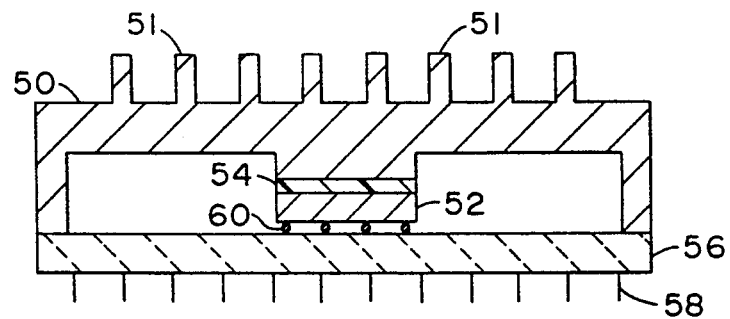

With reference now to FIG. 3, this figure shows an electronic package. This package incorporates an MMC product of the invention in the form of a vacuum die cast, monolithic seal band/lid/heat exchanger combination 50. The heat exchanger may bear fins 51, which may be pin fins or plate fins. The monolith additionally has a pedestal on the underside of the lid. A representative integrated circuit chip 52 is mounted on this pedestal by way of an interposed compliant layer 54 having heat-conducting properties, such as Thermogrease or other thermoconductive bridge material. While this illustrates a single-chip module, it is evident that the concept of this embodiment may readily be expanded to provide for a multichip module.

It is to be noted that the use of "monolithic" herein is intended to indicate that units occur together as one piece without the interposition of a bonded joint, such as a brazed joint. Thus, for instance, it is known to make a heat-exchanger lid unit by brazing separate heat exchanger and lid units together.

The monolithic combination is sealed by low temperature soldering (low temperature, in order not to damage the integrated circuit) to the multilayer alumina substrate 56. Chip 52 is electrically connected to pins 58 using solder beads 60 contacting conductive paths through the alumina substrate.

The MMC material of the combination 50 contains proportions of aluminum alloy matrix and silicon carbide aggregate such that its coefficient of thermal expansion is near to, or matches, that of the alumina substrate 56, in order to avoid, or reduce, stressing of the seal at the MMC-alumina joint during thermal excursions caused, for instance, by heat emitted by the chip during its operation.

Figure 4:
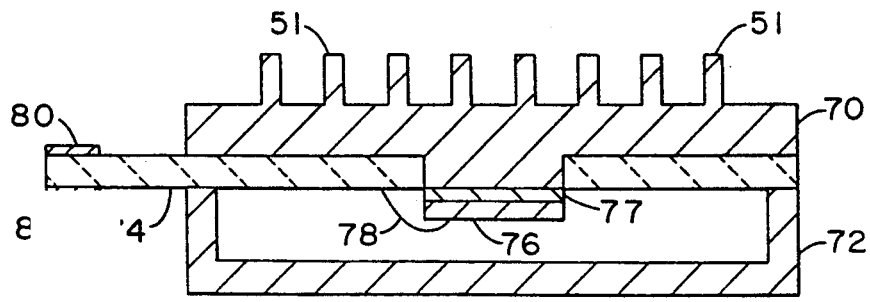

FIG. 4 illustrates an electronic package composed of an MMC monolithic lid/heat exchanger piece 70 and an MMC box 72 both soldered, for sealing, to a multilayer alumina substrate 74. The chip 76 is soldered by solder 77 to a pedestal on the lower side of the lid and is connected by wire bonding represented by wire 78, or any other suitable means, to an edge card connector 80.

EXAMPLES

To test the invention, MMC material for potential electronic package applications were manufactured. The goal for these applications is to produce material having a high thermal conductivity and a coefficient of thermal expansion (CTE) approaching or matching that of alumina having an average CTE in the range room temperature to 250° C., of about 6.5 to 6.6 ppm/K, a chip substrate material typically used in electronic packaging. In theory, to reach a 6.5 ppm/K CTE using aluminum or aluminum alloys reinforced by silicon carbide particulate (SiCp), which has a CTE of about 4.7 ppm/K, the aggregate level has to be in the range of 75 v % to 80 v %. Furthermore, electronic packages must have very tight tolerance in dimension (as low as 0.001") and surface flatness (0.001"/in), and those with integrated heat sinks have complex shapes. Thermal conductivity of SiCp can vary considerably, depending, for instance, on purity. Purity may affect thermal conductivity principally by way of interfacial effects in an MMC, rather than by changes in the bulk thermal conductivity of the SiCp. In any event, combinations of aluminum matrix and different grades of SiCp permit considerable latitude in achieving high thermal conductivity. The SiCp used for this first set of tests resulted in MMC's of lower thermal conductivity as compared to thermal conductivities achieved with the SiCp sold by LONZA INC. of Fair Lawn, N.J., USA, under the designation CARBOGRAN® <<green>>.

Three different loading levels, 50 v %, 65 v %, and 75 v %, were evaluated. The 50 v % MMC was produced by packing silicon carbide particulate into a shaped die cavity. Additionally, 50 v % silicon carbide green preforms, shaped compacts of the particulate and organic binder, were obtained from Norton Company, Worcester, Mass. For the higher level loadings, green preforms containing 65 v % and 75 v % silicon particulate were obtained from Technical Ceramic Laboratories, Inc., Alpharetta, Ga. These green preforms were first heated to 500 C. slowly (25 C./hr) and held for 1 hour to burn off the organic binders without cracking the preform. The preform was further heated to 950 C. using a high heating rate (100 C./hr) and held for 4 hours to produce partial sintering for development of mechanical strength needed to transfer it to a die casting cavity and for infiltration erosion and cracking resistance.

A molten metal charge for the matrix was prepared and held at 700 C. The chemistry of the melt was checked. Melt compositions are given below. A partially sintered preform was held at the same time at 700 C. in a separate electric resistance furnace. The die and fill chamber were cleaned, lubricated and preheated to 250 C. The lubricants, which were applied manually by spraying, were: a lubricant with 4 v % graphite powder, 96 v % water, for a die cavity, which had steel walls (in the case of a die cavity lined with graphite, the graphite served as a solid lubricant, and no separate spraying of lubricant into the die cavity was needed); and an oil base lubricant "OILDAG" supplied by Acheson Colloids Co., Port Huron, Mich. for the piston.

The preheated preform was placed inside the die cavity, and the die closed and locked. A fixed amount of melt was then hand-ladled into the fill chamber through a feeding hole at the top of the fill chamber. Immediately after the molten metal introduction to the fill chamber, the piston was activated to start a forward move at the speed of 10 in/min. After passing the metal feeding hole and sealing the fill chamber against outside air, the piston head stopped for a predetermined period, normally 2 to 4 seconds. During this period, the vacuum system, which had been activated since the start of the casting, evacuated the cavity and the preform to 29 mm Hg absolute pressure. As the piston resumed the forward movement, the melt was pushed toward the cavity and the preform. The speed of the piston head was lowered to 4 in/min., in order that the preform not be fractured or eroded by the infiltrating metal melt. Just before the melt completely filled the cavity, the valve at the vacuum line connecting the die cavity and the preform to the vacuum pump was closed to prevent the melt from entering the vacuum line. As the piston continued to move forward with a slower speed, 4 to 5 in/min., pressure built up on the melt, reaching up to 10,000 psi, and producing a full metal infiltration into the preform when the piston finally stopped. A slower piston head speed (4 in/min.) was used to prevent any preform compression and cracking by pressure built-up before start of metal infiltration into the preform. The infiltration metal and the preform in the cavity began to solidify rapidly under the pressure. Upon the completion of solidification, the piston started to retract to the original starting position, the die opened and ejector pins pushed the infiltrated preform, the MMC, out of the cavity.

Figure 6:
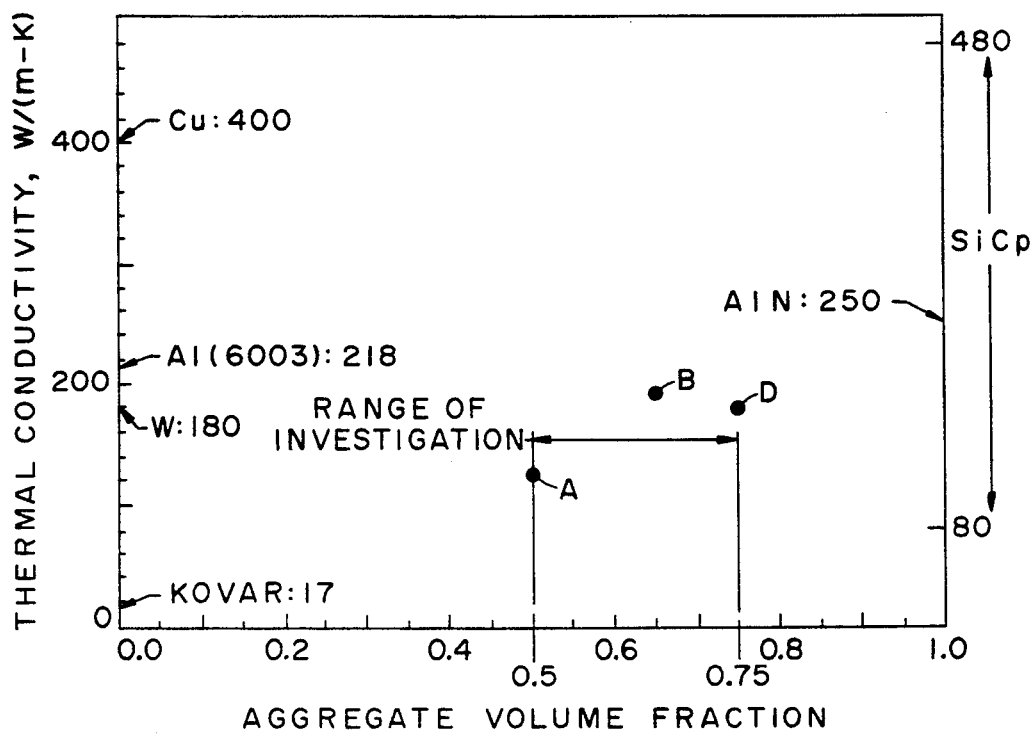
FIG. 6 is a plot of thermal conductivity versus SiCp aggregate volume fraction.
Figure 7:
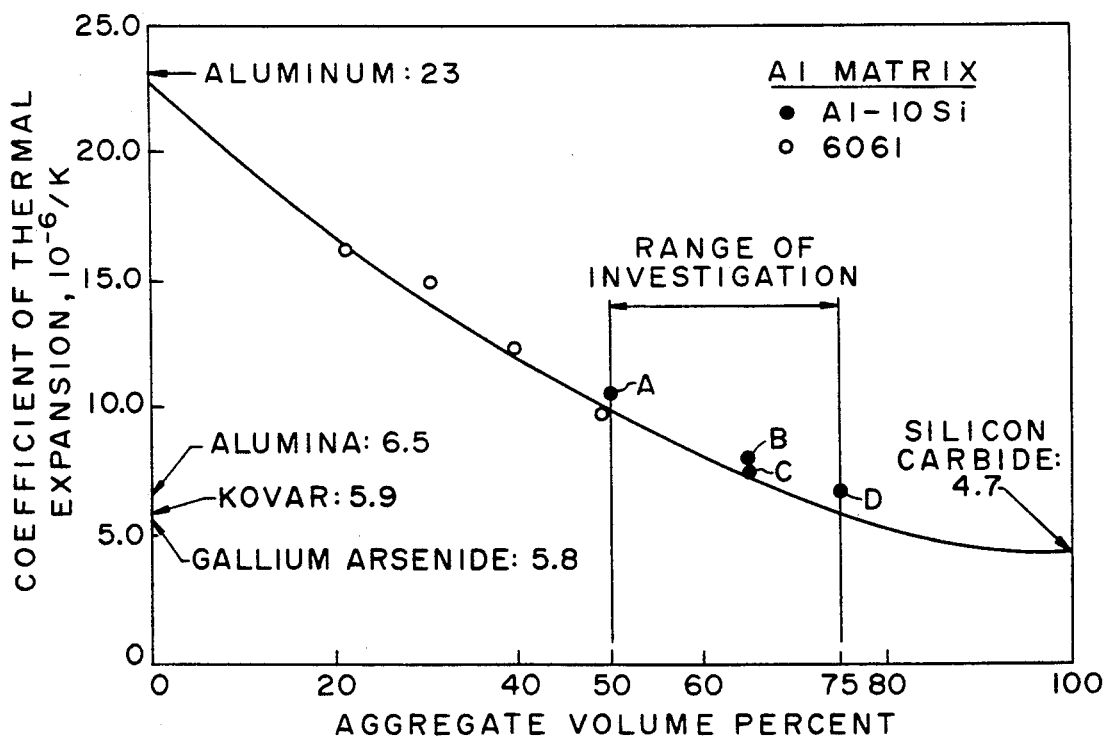
FIG. 7 is a plot of coefficient of thermal expansion versus SiCp aggregate volume fraction.
Figure 8B:
FIGS. 8a to 8d are photomicrographs of sections of a 0.25-inch thick by 1.5-inch square, flat MMC whose matrix is A356 aluminum alloy and which contains 65 v % SiC particulate as aggregate.
Figure 8D:
Figure 8A:
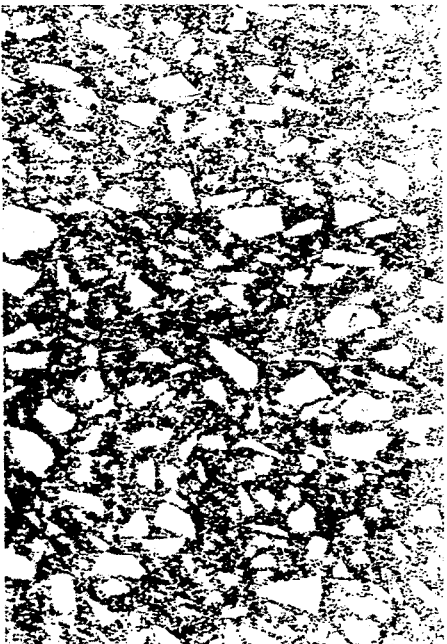
Figure 8C:

In terms of product, several 0.5" thick, 2"×3" Al alloy (A356 & Al-12 w %Si (A413))/50 v % commercial grade SiCp samples for electronic package application were produced using the vacuum die caster. Micrographic evaluation of the samples revealed porosity-free infiltration as illustrated in FIGS. 5a–5d for the case of A356 matrix. Subsequently, some of the samples (Al-12 w %Si/50 v %SiCp) were tested to determine physical properties such as thermal conductivity and CTE. The test results revealed that they had 124 W/(m-K) thermal conductivity, point A in FIG. 6 and 10.8 ppm/K CTE, point A in FIG. 7. FIG. 7 also indicates that, to match the 6.5 ppm/K CTE of an alumina electronic package sublayer, the volume loading of SiCp has to increase to the range of 75 v % to 80 v %.

Figure 9B:
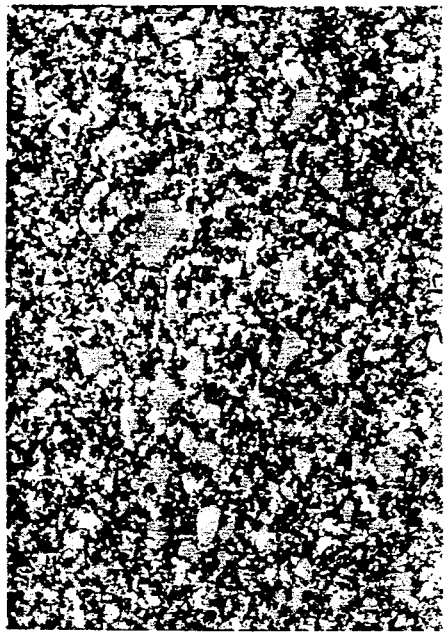
FIGS. 9a to 9d are photomicrographs of sections of a 0.375-inch high by 1-inch by 2-inch MMC box whose matrix is Al-10 w %Si aluminum alloy and which contains 65 v % SiC particulate as aggregate.
Figure 9D:
Figure 9A:
Figure 9C:
Figure 10A:
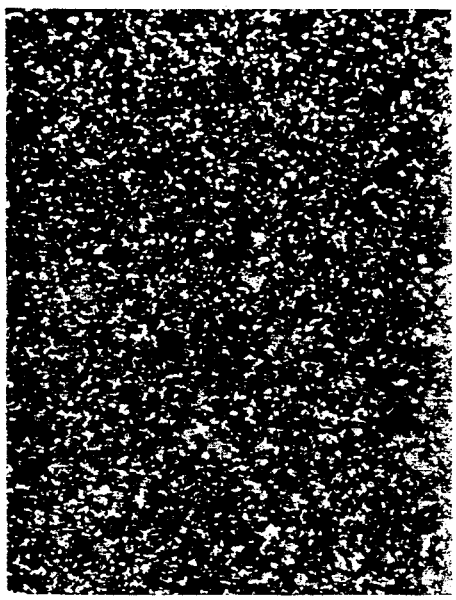
FIGS. 10a to 10d are photomicrographs of sections of a 0.10-inch thick by 2-inch square, flat MMC whose matrix is Al-10 w %Si aluminum alloy and which contains 65 v % SiC particulate as aggregate.
Figure 10B:
Figure 10C:
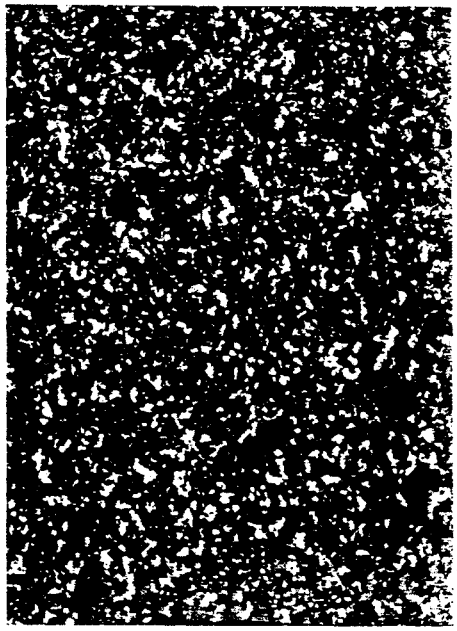
Figure 10D:
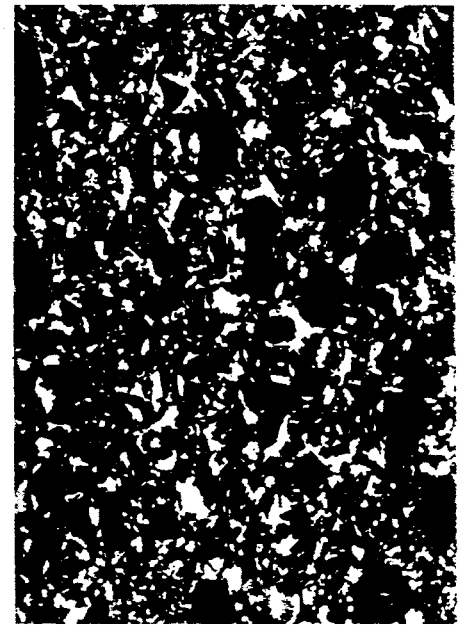
Figure 11A:
FIGS. 11a to 11d are photomicrographs of sections of a 0.10-inch thick by 1-inch by 2-inch, flat MMC whose matrix is Al-10 w %Si aluminum alloy and which contains 65 v % SiC particulate as aggregate.
Figure 11B:
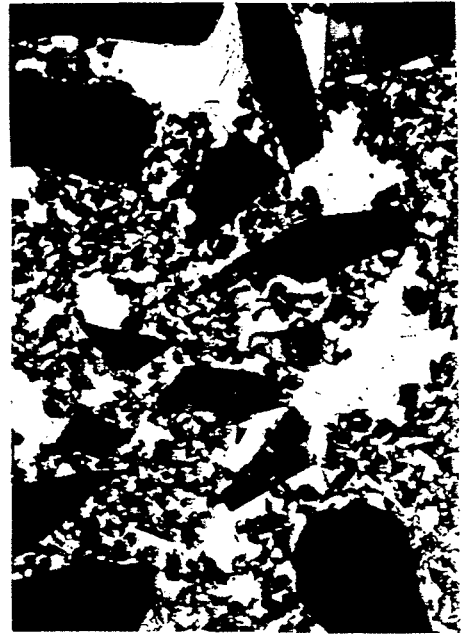
Figure 11C:
Figure 11D:
Figure 12A:
FIGS. 12a to 12d are photomicrographs of sections of a 0.10-inch thick by 1-inch by 2-inch, flat MMC whose matrix is Al-10 w %Si aluminum alloy and which contains 75 v % SiC particulate as aggregate.
Figure 12B:
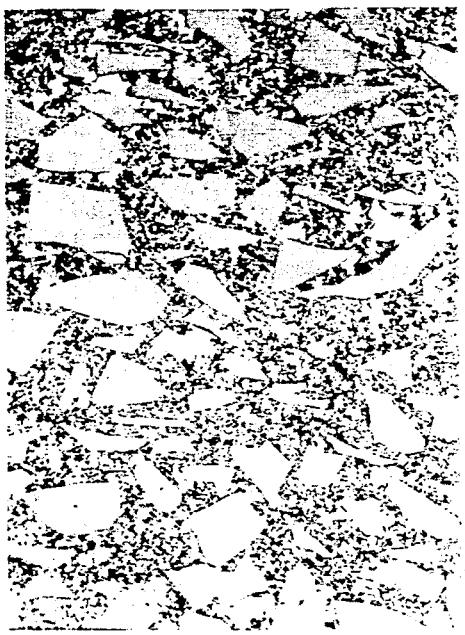
Figure 12C:
Figure 12D:

For other examples of product, the following SiCp (commercial grade) preforms containing 65 v % SiCp were obtained from Technical Ceramics Laboratories Inc. (TCL), Alpharetta, Ga.:
1. two ¼" thick, 1.5" by 1.5", partially sintered flat preforms;
2. ten 1" by 2" green preform of electronic package box with ¼" thick bottom and 1/16" thick, 0.375" high side wall; and
3. two 0.100" thick, 6" by 6" green flat preforms. All of these preforms were infiltrated with Al-10 w %Si (compositional limits other than the 10 wt-% silicon were the same as for A413) aluminum alloy without porosity using the vacuum die caster. FIGS. 8a through 10d present micrographs of the infiltrated samples. As seen in these figures, two groups of SiCp sizes were utilized to achieve the 65 v % loading level; namely, a fine size of about 1 to 2 microns and a large size of about 100 to 300 microns. The fine size fills interstices between the large size particles, in order to increase the volume percent loading. Some of the samples were tested for CTE and it was found to be 7.5 ppm/K (Point C in FIG. 7). FIGS. 9c and 9d show in the light colored regions at the upper right and upper half, respectively, aggregate-free matrix material in the box floor. This aggregate-free material was achieved by selective configuring of the preform to obtain a spacing of the preform from the die cavity wall at locations where aggregate-free material was desired. This was a test of the ability of the invention to produce aggregate-free surface layers for joining. The photomicrographs show good bonding between the MMC body and the aggregate-free surface layer. A graded transition from MMC to an aggregate-free surface layer may be achieved, for example, by making preforms in which the aggregate interstices are increasingly empty as one proceeds from the interior of the preform to the surface of the preform. Sample preparation for thermal conductivity determination is in progress (I will reword this upon receipt of the data).

Flat preforms measuring 0.1" thick by 1" by 2", manufacturered by TCL with loadings of 65 and 75 v % of Lonza's CARBOGRAN® <<green>> SiCp, were infiltrated by vacuum die casting, as above described, with Al-10 w % Si aluminum alloy. CTE's averaged 8.0 ppm/K for the 65 v % samples (point B in FIG. 7) and 6.7 ppm/K for the 75 v % samples (point D in FIG. 7); thermal conductivites were 187 W/(m-K) for the 65 v % samples (point B in FIG. 6) and 179 W/(m-K) for the 75 v % samples (point D in FIG. 6). Photomicrographs are presented in FIGS. 11a to 12d. FIGS. 11a to 11d are photomicrographs of sections of the 65 v % material, while FIGS. 12a to 12d are for the 75 v % case.

Flat preforms measuring 0.1" thick by 1" by 2", manufacturered by TCL with loadings of 65 and 75 v % of Lonza's CARBOGRAN® <<green>> SiCp, were also infiltrated by vacuum die casting, as above described, with 99.995 w % pure aluminum. Photomicrographs are presented in FIGS. 13a to 14b. The use of pure aluminum for the matrix is advantageous, for example, for the reason that there are then no other phases, such as the silicon-rich phases of Al-10 w %Si aluminum alloy, which can interfere with anodizing or with plating for preparing the aluminum for soldering. FIGS. 13a and 13b are photomicrographs of sections of the 65 v % SiC material, while FIGS. 14a and 14b are for the 75 v % material.

What is claimed is:

1. An MMC manufacturing method comprising loading a partially sintered aggregate preform containing at least 65 v % aggregate into a die cavity, providing a charge of molten metal, applying vacuum to said aggregate and molten metal, heating the aggregate, and molten metal to assure complete infiltration of the aggregate, moving the molten metal by a piston to infiltrate the aggregate in the die cavity, piston speed being at a level for avoiding damage to the preform, and solidifying the molten metal which has infiltrated the aggregate.

* * * * *

UNITED STATES PATENT AND TRADEMARK OFFICE
CERTIFICATE OF CORRECTION

PATENT NO. : 5,259,436
DATED : November 9, 1993
INVENTOR(S) : David I. Yun et al It is certified that error appears in the above-indentified patent and that said Letters Patent is hereby corrected as shown below:

Col. 10, line 57            After "cavity,", insert --heating the die cavity,--.

Col. 10, lines 59-61      After "metal,", delete "heating the aggregate, and molten metal to assure complete infiltration of the aggregate,".

Col. 10, line 63            After "preform,", insert --said heating of die cavity assuring complete infiltration of the aggregate,--.

Signed and Sealed this

Twenty-sixth Day of April, 1994

Attest:

BRUCE LEHMAN

*Attesting Officer*          *Commissioner of Patents and Trademarks*